US007502378B2

(12) United States Patent
Lajolo et al.

(10) Patent No.: US 7,502,378 B2
(45) Date of Patent: Mar. 10, 2009

(54) FLEXIBLE WRAPPER ARCHITECTURE FOR TILED NETWORKS ON A CHIP (75) Inventors: Marcello Lajolo, Princeton, NJ (US); Subhek Garg, Princeton, NJ (US)

(73) Assignee: NEC Laboratories America, Inc., Princeton, NJ (US)

( * ) Notice: Subject to any disclaimer, the term of this patent is extended or adjusted under 35 U.S.C. 154(b) by 0 days.

(21) Appl. No.: 11/947,747

(22) Filed: Nov. 29, 2007

(65) Prior Publication Data
US 2008/0211538 A1 Sep. 4, 2008

Related U.S. Application Data

(60) Provisional application No. 60/867,601, filed on Nov. 29, 2006.

(51) Int. Cl.
*H04L 12/56* (2006.01)
*H04L 12/66* (2006.01)

(52) U.S. Cl. ............... 370/413; 370/353; 370/354; 370/355; 370/356; 326/40; 326/41; 326/47

(58) Field of Classification Search ......... 370/352–356, 370/412–413; 326/37–41, 47
See application file for complete search history.

(56) References Cited

U.S. PATENT DOCUMENTS

| 5,974,487 | A  | * | 10/1999 | Hartmann | ............ | 710/100 |
| 6,973,032 | B1 | * | 12/2005 | Casley et al. | ............ | 370/230 |
| 7,215,637 | B1 | * | 5/2007 | Ferguson et al. | ........ | 370/230.1 |
| 7,394,288 | B1 | * | 7/2008 | Agarwal | ............ | 326/39 |
| 7,461,236 | B1 | * | 12/2008 | Wentzlaff | ............ | 712/10 |
| 2004/0151197 | A1 | * | 8/2004 | Hui | ............ | 370/412 |
| 2006/0150138 | A1 | * | 7/2006 | Rhee | ............ | 716/14 |

* cited by examiner

*Primary Examiner*—Rexford Barnie
*Assistant Examiner*—Jason Crawford
(74) *Attorney, Agent, or Firm*—Brosemer, Kolefas & Associates, LLC (57) ABSTRACT

A wrapper organization and architecture for networks on a chip employing an optimized switch arrangement with virtual output queuing and a backpressure mechanism for congestion control.

8 Claims, 7 Drawing Sheets

FLEXIBLE WRAPPER ARCHITECTURE FOR TILED NETWORKS ON A CHIP

CROSS REFERENCE TO RELATED APPLICATIONS

This application claims the benefit of U.S. Provisional Application No. 60/867,601 filed Nov. 29, 2006.

FIELD OF THE INVENTION

This invention relates generally to the field of very large scale integrated circuits and in particular to arrangements that facilitate communication among networks on a chip (NoC). More particularly, it pertains to the application and implementation of NoC design methodologies to systems on a chip (SoC).

BACKGROUND OF THE INVENTION

Large dies containing very large scale integrated circuits present significant problems associated with getting signals from one portion of the die to another. Accordingly, techniques and/or developments that facilitate the communication of individual components on a chip would represent a significant advance in the art.

SUMMARY OF THE INVENTION

Such advance in the art is made according to the principles of the present invention directed to a flexible wrapper for tile based networks on a chip (NoCs). Accordingly, a specific NoC topology utilizing a particular routing methodology is combined with an efficient congestion control mechanism thereby preserving chip space and increasing communication efficiency.

BRIEF DESCRIPTION OF THE DRAWING

A more complete understanding of the present invention may be realized by reference to the accompanying drawings in which.

DETAILED DESCRIPTION

The following merely illustrates the principles of the invention. It will thus be appreciated that those skilled in the art will be able to devise various arrangements which, although not explicitly described or shown herein, embody the principles of the invention and are included within its spirit and scope.

Furthermore, all examples and conditional language recited herein are principally intended expressly to be only for pedagogical purposes to aid the reader in understanding the principles of the invention and the concepts contributed by the inventor(s) to furthering the art, and are to be construed as being without limitation to such specifically recited examples and conditions.

Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, the diagrams herein represent conceptual views of illustrative structures embodying the principles of the invention.

Figure 1:
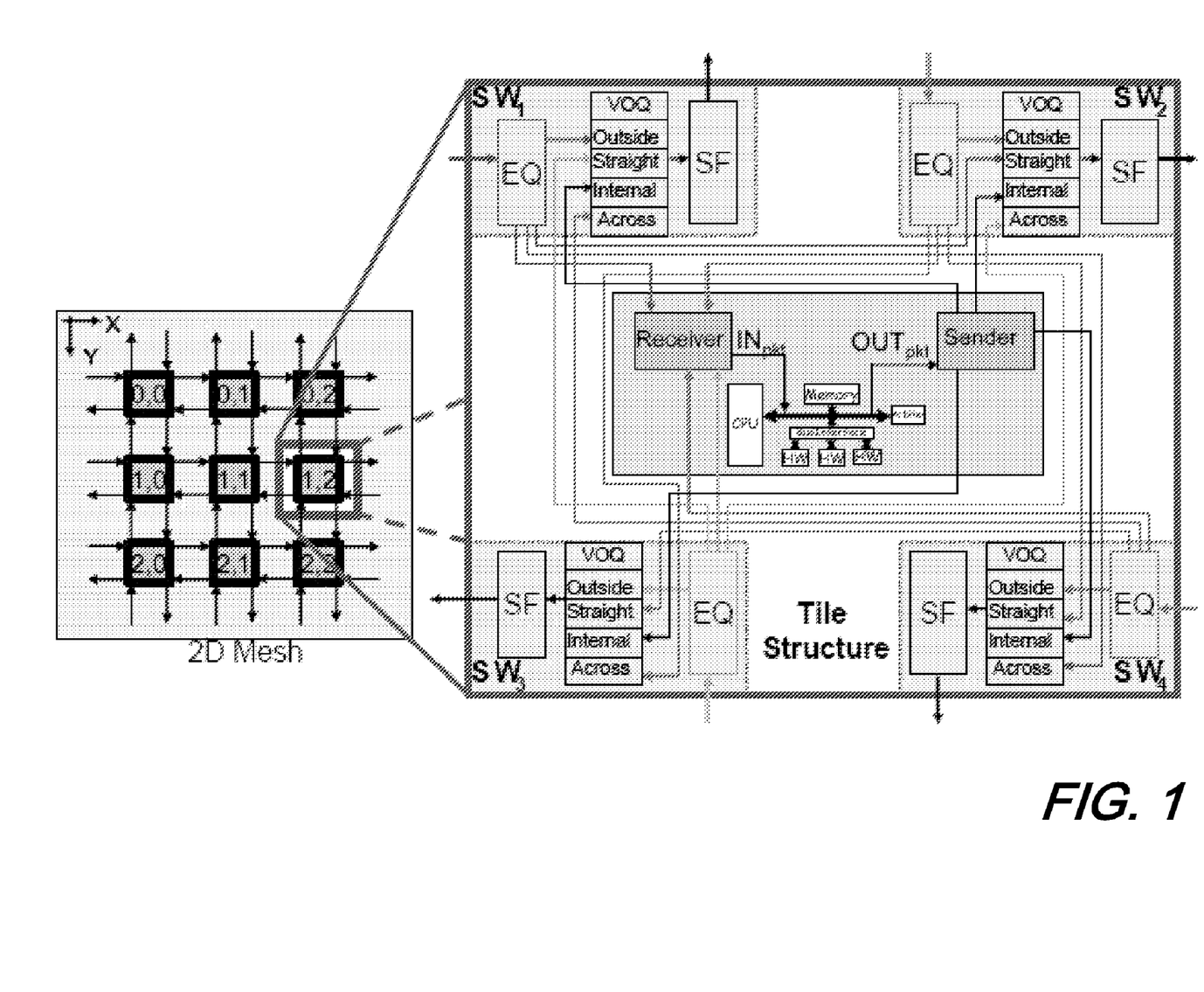
FIG. 1 is a block diagram of a two-dimensional mesh network-on-a-chip architecture according to the present invention.

With initial attention directed to FIG. 1, there it shows—on the left—a two-dimensional mesh inter-connection topology. As can be readily observed, the architecture comprises multiple tiles organized in a rectangular grid or "Manhattan-like" structure. A tile wrapper provides access and isolation to each tile. Collectively, the 2D mesh of tiles form a network-on-a-chip (NoC).

Advantageously, such a NoC can be either homogeneous or heterogeneous depending on the set of architectural elements (i.e., processors, buses and hardware peripherals) employed in each of the tiles. As used herein, a tile may be a computation unit, a storage unit or both. Typical examples of tiles are embedded processors and DSP cores provided with caches as well as local memories, with both dedicated and configurable hardware resources. A tile wrapper routes and buffers messages between a set of four adjacent tiles through input and output channels.

With continued reference to the FIG. 1, and in particular the right side of FIG. 1, an exploded view depicting the internal organization of a tile is shown. As shown therein, four switches (SW1 to SW4) are depicted, along with a receiver and a sender. The receiver and sender act as interfaces between the wrapper and the internal tile. Advantageously, the internal tile may contain multiple buses and processors—but only has one bus connected to the tile wrapper.

When constructed according to the principles of the present invention, a NoC architecture provides a communication infrastructure for the tiles. Accordingly, two significant objectives underlying this NoC architecture are:

1. To facilitate the development of each tile as a stand-alone block and create the NoC by connecting them as elements in the network; and
2. To provide a highly scalable and configurable network that can adapt to the needs of project requirements, while maintaining the generality of application development methods and practices.

Advantageously, tile dimensions may shrink with technology advances. Consequently, the number of resources and the tile-to-tile bandwidth will grow, but the on-chip communication protocols need not be affected. As a result, such systems appear as a heterogeneous network of resources executing local computations. In particular, individual tiles operate asynchronously with respect to one another and synchronization and communication is provided by primitives implemented by passing messages over the network.

Routing Constraints

Figure 2:
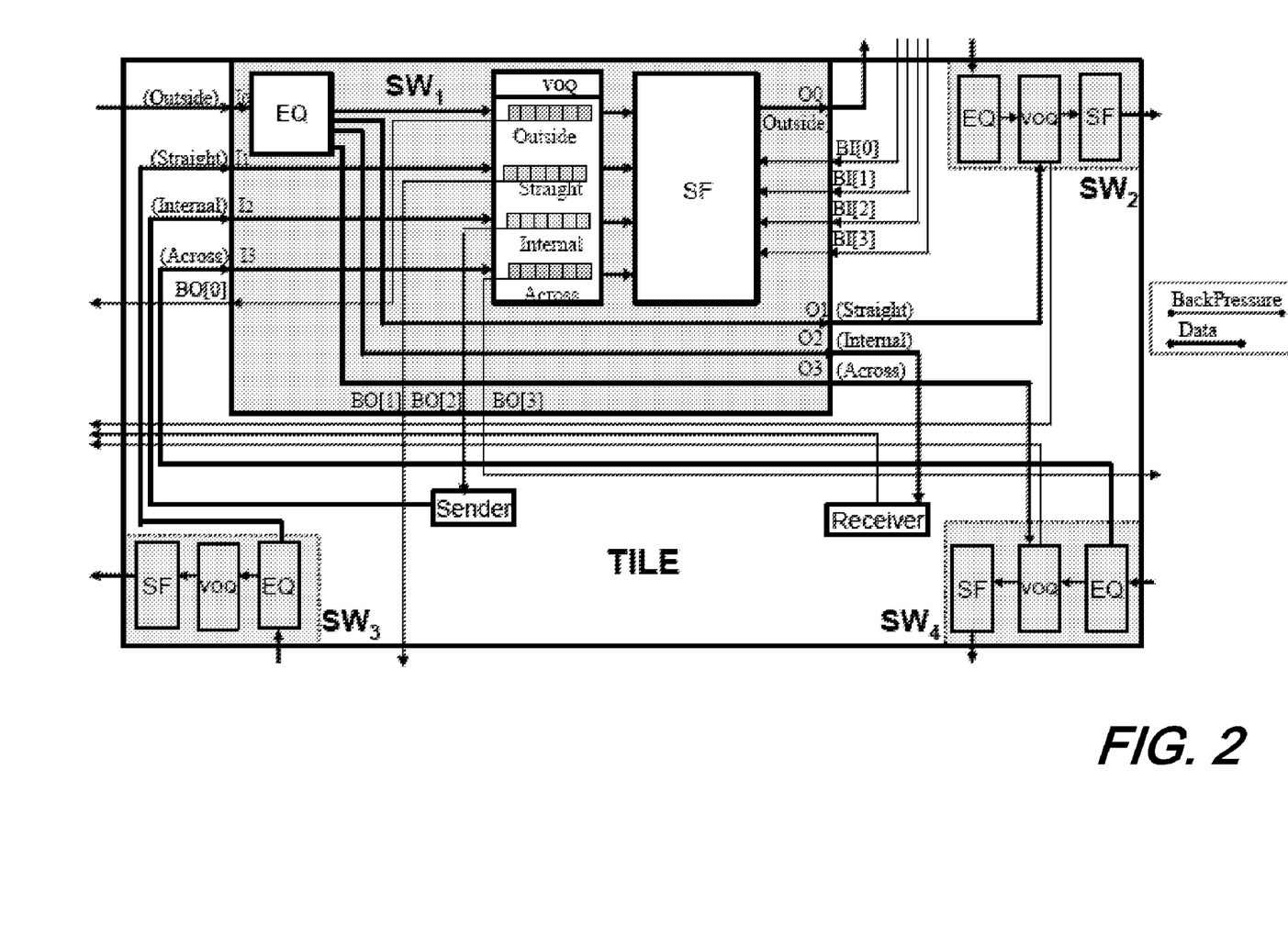
FIG. 2 is a block diagram of a switch architecture with backpressure signals.

In a preferred embodiment of our tile wrapper, each switch has four incoming links. With reference to FIG. 2, it can be seen that incoming connections include the following:

1. Outside: packets coming from an adjacent tile;
2. Straight: packets coming from the adjacent switch inside the same tile;
3. Internal: packets generated in the same tile; and
4. Across: packets coming from the diagonally across switch in the same tile.

Similarly, and with continued reference to FIG. 2, it can be seen that each switch (SW1 ... SW4) has four outgoing links. The outgoing connections comprise the following scenarios:

1. A packet arriving on the Outside input can go in any of the four possible directions: it can turn left; it can go straight to the adjacent switch; it may be sent internally—when it has reached its final destination, or it can turn right and be directed to the switch which is diagonally across from it.
2. A packet arriving on the Straight input has been sent by an adjacent switch inside the same tile. Consequently, it can only be directed outside.
3. A packet arriving on the Internal input can only be directed outside. In this case, the sender unit has selected the switch based on the direction in which to send the packet out.
4. A packet arriving on the Across input has been sent by the switch positioned diagonally across from the receiving switch within the same tile. That packet may only be sent outside.

Fourswitch Tile Architecture

With continued reference to FIG. 2, there is shown the internal architecture of a switch in our four-switch tile architecture. All switches are identical, with four input and output ports and three internal components: an enqueuing module (EQ), internal memory (VOQ) and a dequeuing module (SF).

When more than one packet destined to the same output port arrive at different input ports of a switch in the same time slot, they cannot all be forwarded immediately. Only one packet can be transmitted from an input port, and hence other packets must be stored in internal queues for later transmission. Accordingly, the design of the queues in the switches is of critical importance for achieving high throughput and low latency.

Advantageously, queuing may be implemented as centralized queues, independent queues at each input port, or independent queues at each output port. Centralized queuing suffers from a number of drawbacks including those affecting performance and implementation. Independent output queuing suffers from the fact that a switch must operate as fast as the sum of the speeds of its input ports, or the queues must have as many write ports as the number of input ports on the switch to accommodate simultaneous packet arrivals. Implementing buffers with multiple write ports increases their size and reduces their performance.

Consequently independent input queuing for switches is the preferred method. Advantageously input queue switches do not require a memory access time faster than line speed, but nevertheless suffer from a head-of-line (HOL) blocking problem that limits their maximum theoretical throughput to 57%. This problem results from the fact that a single packet at the head of the queue whose destination output port is busy can block all other packets in that queue from being transmitted even if their destination output ports are free.

In order to overcome the HOL problem, we employ Virtual Output Queue (VOQ) switches. Each employs four ports which we have determined to be advantageous due to the forwarding mechanism(s) employed and described previously. When considering the forwarding mechanism used, it becomes easy to realize that output contention can only happen on the outside port, as packets arriving at all four inputs can be directed to that port. The packets coming from the outside input can be routed to all four output ports. Furthermore, the packets coming from the outside port and going to the straight or across queues are not subjected to any arbitration inside that switch and can be directly enqueued in the next switch where they will be arbitrated. As a result, no queues are needed for straight and across outputs. Similarly, the internal queue is also not needed since the packets are directly enqueued in the receiver module. As a result, only four VOQs are needed in every switch.

Routing Algorithm and Flow Control

In the tile based NoC wrapper, switches are responsible for packet routing and forwarding. Due to the limited amount of buffering and data acceptance between routers in a NoC, flow control is added to the routing algorithm. In a preferred embodiment, we use wormhole routing, a technique where packets are split into flits (flow control digits) that are forwarded independently to the next router as soon as it is ready to accept them.

Advantageously, we use a source-based dimension order routing scheme where each flit follows the same routing path thereby eliminating any need to reorder flits at the destination. The routing decision is made in the source node and the routing path to the destination is completely deterministic. For our purposes dimension-order routing is straightforward to implement, but it suffers from the fact that it does not provide any adaptiveness.

As a result, adaptiveness is added to the routing algorithm at the source node, where, based on congestion information provided by a backpressure scheme implemented in the tile wrappers, we can choose between minimizing first either the X or the Y distance between source and destination and, as an alternative, it is also possible to route packets in one of the two remaining directions. The number of tiles traversed by a packet in order to reach its destination can hence be chosen by taking into account the dynamic congestion on the chip.

The routing decision is performed in the EQ module and selects one among four possible routing directions (outside, straight, internal and across). The forwarding direction has been pre-determined in the previous tile and the corresponding queue identifier has been encoded in the header of the packet. The EQ module will read this information from the header and enqueue the packets accordingly. As discussed earlier, packets destined to straight or across directions are enqueued in the VOQs of the next switch, whereas packets destined to the outside direction are enqueued in the VOQ of the same switch.

In case of multiple traffic flows competing for the outside direction, the SF module arbitrates between them in a round robin fashion. Finally, packets that have reached their destination tile are directly forwarded to the receiver module through the internal output port. Based on the forwarding direction, the EQ module will determine the coordinates of the next tile to precompute the routing decision for the next EQ module. The queue identifier associated with the next routing direction is then updated in the packet header. This architecture, based on look-ahead routing decisions, leads to an interesting property: a packet is enqueued only once in every tile of its routing path.

A packet can traverse a tile either by turning left or by going internally to the other switch and then outside. In the first case it is clear that the packet will traverse only one switch inside the tile and hence it will be enqueued only there. In the second case, the packet will be enqueued only in the next switch. This property results in a very predictable worst and best case delay for a packet traversing a tile.

Congestion Control

Congestion control is implemented using backpressure signals for each VOQ, based on queue utilization (See FIG. 2). Backpressure signals are set by EQ modules when a set threshold is reached after an enqueue operation and reset by SF modules when queue utilization is below the set threshold.

Backpressure signals also originate from receiver modules. Every receiver has four queues, one for each incoming direction, and their backpressure signals are managed by the receiver module itself. When the SF module dequeues a packet, it reads the header to determine the queue it will take in the next switch. A packet is not dequeued if the backpressure signal associated with the next queue is high. Before sending a packet, the sender selects a routing direction, and hence a switch, using its routing algorithm. If the backpressure signal associated with the internal queue of the selected switch is high, an alternate direction is selected, thus providing adaptiveness to the routing algorithm in the source tile.

Experimental Setup

Figure 3:
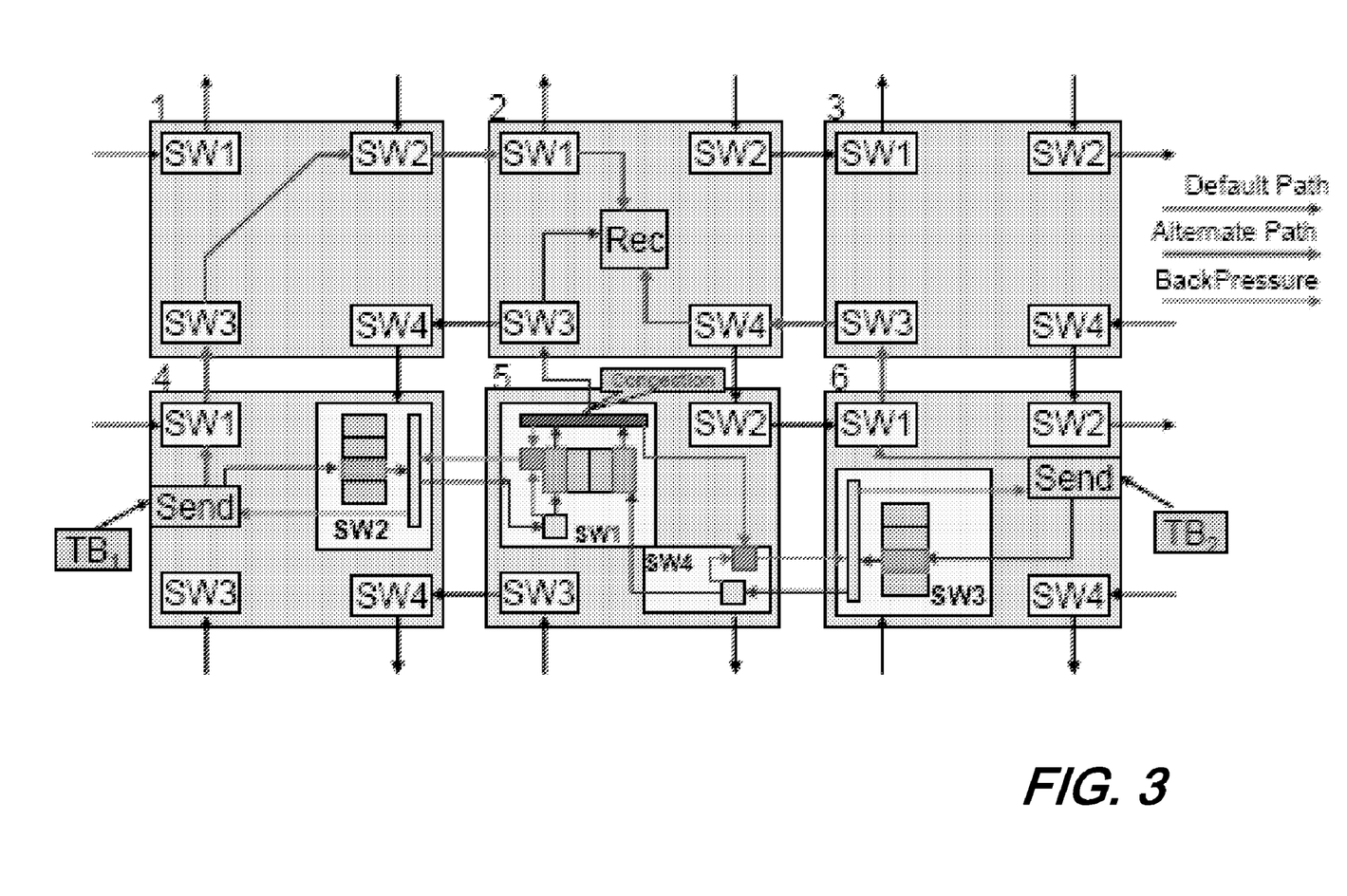
FIG. 3 is a block diagram of an experimental setup.

We now consider the experimental setup shown in FIG. 3 where there are two sustained packet flows: (a) tile 4 ! tile 2 and (b) tile 6 ! tile 2. These flows have a common destination (tile 2) and, in case of the default XY routing, converge in north-west (N-W) switch of tile 5. For both flows, a new packet is generated every three cycles and two cycles are needed in order to enqueued in the N-W switch in tile 5.

Packet Traversal

In flow (a) the sender will create packets by collecting payload bytes from the local bus; in this case the packets are generated by a test-bench. It then enqueues them in internal queue of the north-east (N-E) switch of the same tile (tile 4), since they have to be routed east. The packets will then enter the N-W switch in the next tile (tile 5) through the outside port and will be enqueued in the outside queue. The packets will then enter the destination tile (tile 2) from the outside input port and will be sent directly to the receiver. Similarly, in flow (b) the sender enqueues packets in internal queue of the south-west (S-W) switch of the same tile (tile 6), since the packets have to be routed west. The packets will then enter the south-east (S-E) switch in the next tile (tile 5) through the outside port. Since the packets have to be routed right, they will be enqueued in the across queue of N-W switch of the same tile (tile 5). The packets will then enter the destination tile (tile 2) from the outside input port and will be sent directly to the receiver.

Congestion and Adaptiveness

The two flows compete for output port in N-W switch of tile 5 and cause the queues to grow. For flow (a), the EQ module in the N-W switch of tile 5 will set the backpressure (BP) signal when outside queue grows beyond threshold. The SF module in the N-E switch of tile 4 reads this BP signal and ceases to dequeue packets. This in-turn causes internal queue to grow and sender module observes the queue size. For flow (b), the EQ module in the S-E switch of tile 5 will set the BP signal when across queue of N-W grows beyond threshold. The SF module in the S-W switch of tile 4 reads this BP signal and ceases to dequeue packets. Thus causing sender module to observe the growing size of internal queue of that switch. When a sender module observes that the utilization of the internal queue has grown beyond the threshold level, it selects an alternate routing direction based on the algorithm explained in Section 2.3. For flow (a), the alternate route is tile 4 to tile 1 to tile 2 and for flow (b) the alternate route is tile 6 to tile 3 to tile 2.

Selection of alternate routes causes reduction in utilization of the queues in the primary route. In this example, when outside queue and across queue in the N-W switch of tile 5 go below the BP threshold, the SF module resets their BP signals. For flow (a), the SF module in the N-E switch of tile 4 starts dequeuing when it gets the low BP signal. When the utilization of the internal queue goes below the threshold level, the SF module resets the BP signal to the sender module, which then switches back to the primary route. For flow (b), the SF module in S-W switch of tile 6 works similarly.

Experiment 1: Backpressure Threshold

A first experiment demonstrates with the effect of BP threshold values on the NoC fabric. In this first experimental condition, all queue sizes were fixed to eight packets and BP threshold values were set to 6, 4 and 2 packets. As the BP threshold value was decreased from 6 to 2, the average end-to-end latency for both the flow decreased from 33 cycles to 14 cycles. This effect can be justified by the fact that large BP threshold values delay the propagation of congestion information through BP signals. This causes packets to wait longer in their queues.

Figure 4:
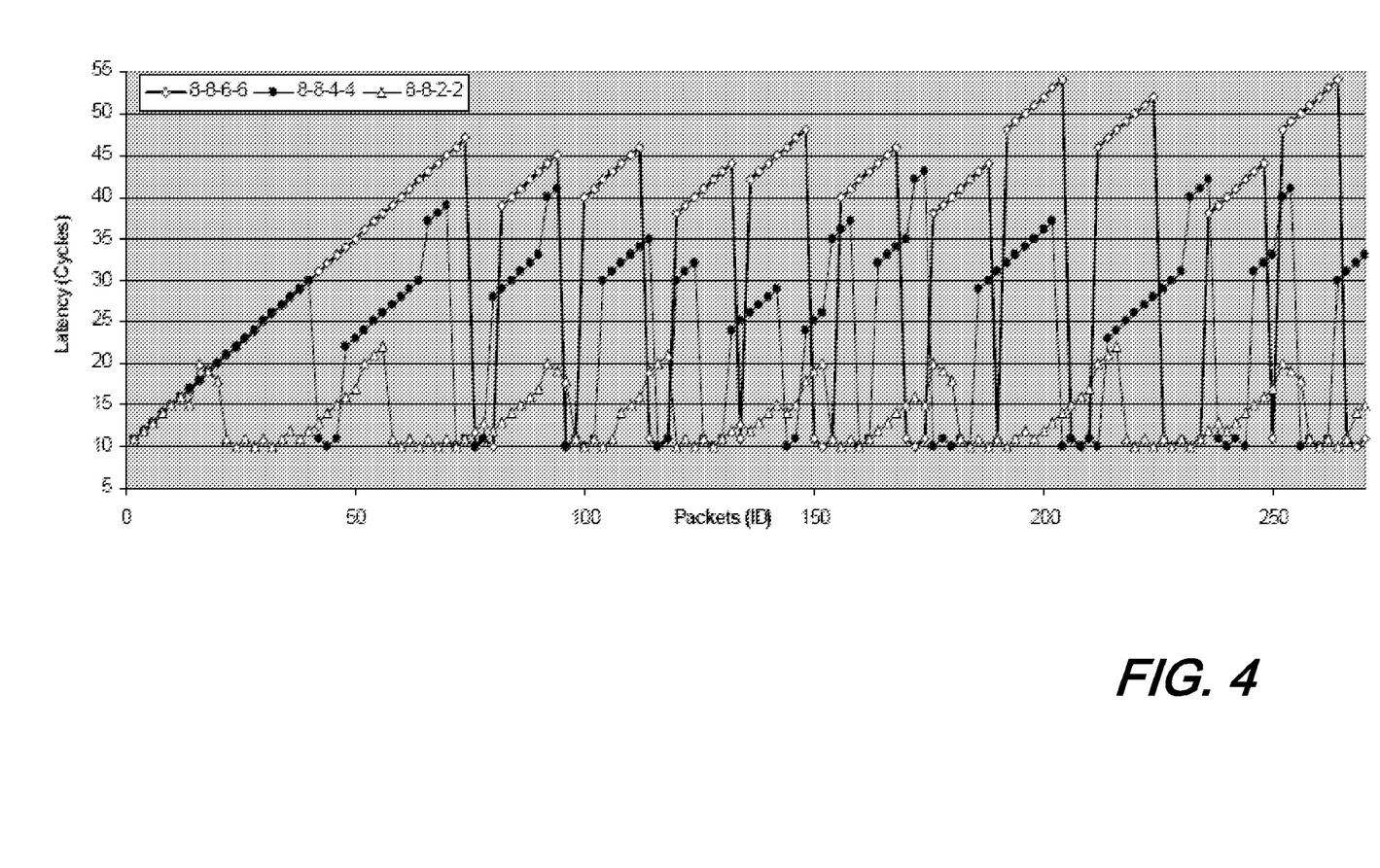
FIG. 4 is a graph showing end-to-end latency for three configurations.

FIG. 4 shows a latency chart for flow (a) in three different configurations, represented by four parameter values: Queue sizes (except internal queue), Internal queue size, BP threshold value (except internal queue) and BP threshold value for internal queue. Configurations used for this figure were 8-8-6-6, 8-8-4-4, and 8-8-2-2. The number of packets in the outside (flow a) and in the across (flow b) queues grows linearly since two packets reach N-W switch of tile 5 every 3 cycles, while it can service only one packet every two cycles. It is evident that latency increases linearly until it drops suddenly because queue reaches BP threshold value and sender sends packets through alternate route. Average latency is large for the configuration: 8-8-6-6, it is lower for 8-8-4-4 and lowest for 8-8-2-2. Large BP threshold values increase the average latency due to the fact that it takes longer to propagate congestion information to the sender in the source tile. Hence packets accumulate in the queues and they have to wait longer before being dequeued.

Figure 5:
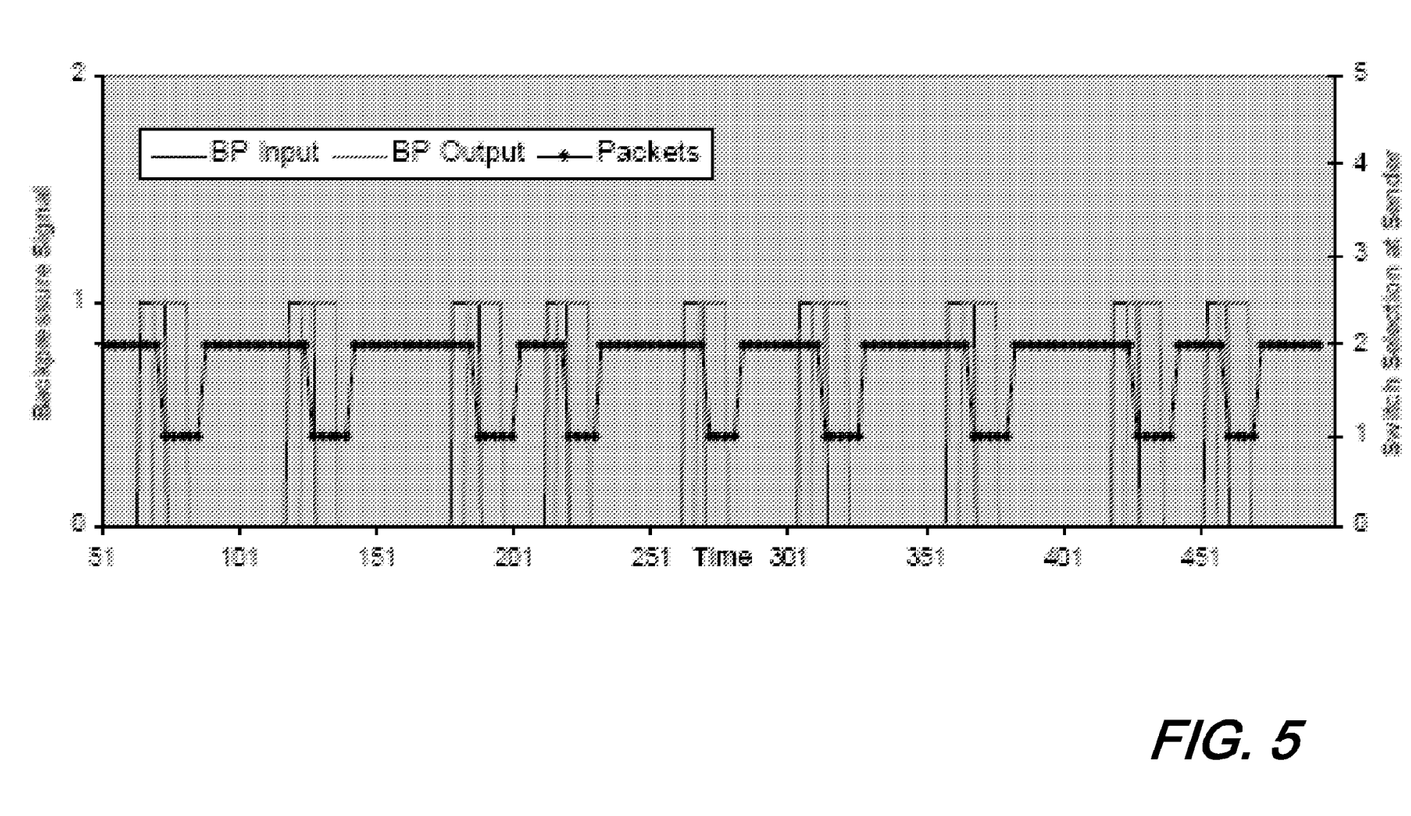
FIG. 5 is a graph showing back pressure propagation and adaptiveness.

FIG. 5 shows a BP chart with adaptiveness in tile 4, it shows input BP signal and output BP signal. Additionally, it also shows switch selection made by sender for outgoing packets. It can be seen that input BP signal forces output BP signal to go high. This is because when input BP signal is high, internal queue in N-E switch of tile 4 starts to grow and reaches the threshold value and consequently the SF module sets the output BP signal. When sender receives high BP signal it makes alternate route selection. Similarly low input BP signal cause reduction in queue utilization and output BP is reset by the SF module thus causing sender to switch back to primary route. Configuration used for this figure was 8-8-2-2.

Experiment 2: Queue Size

Figure 6:
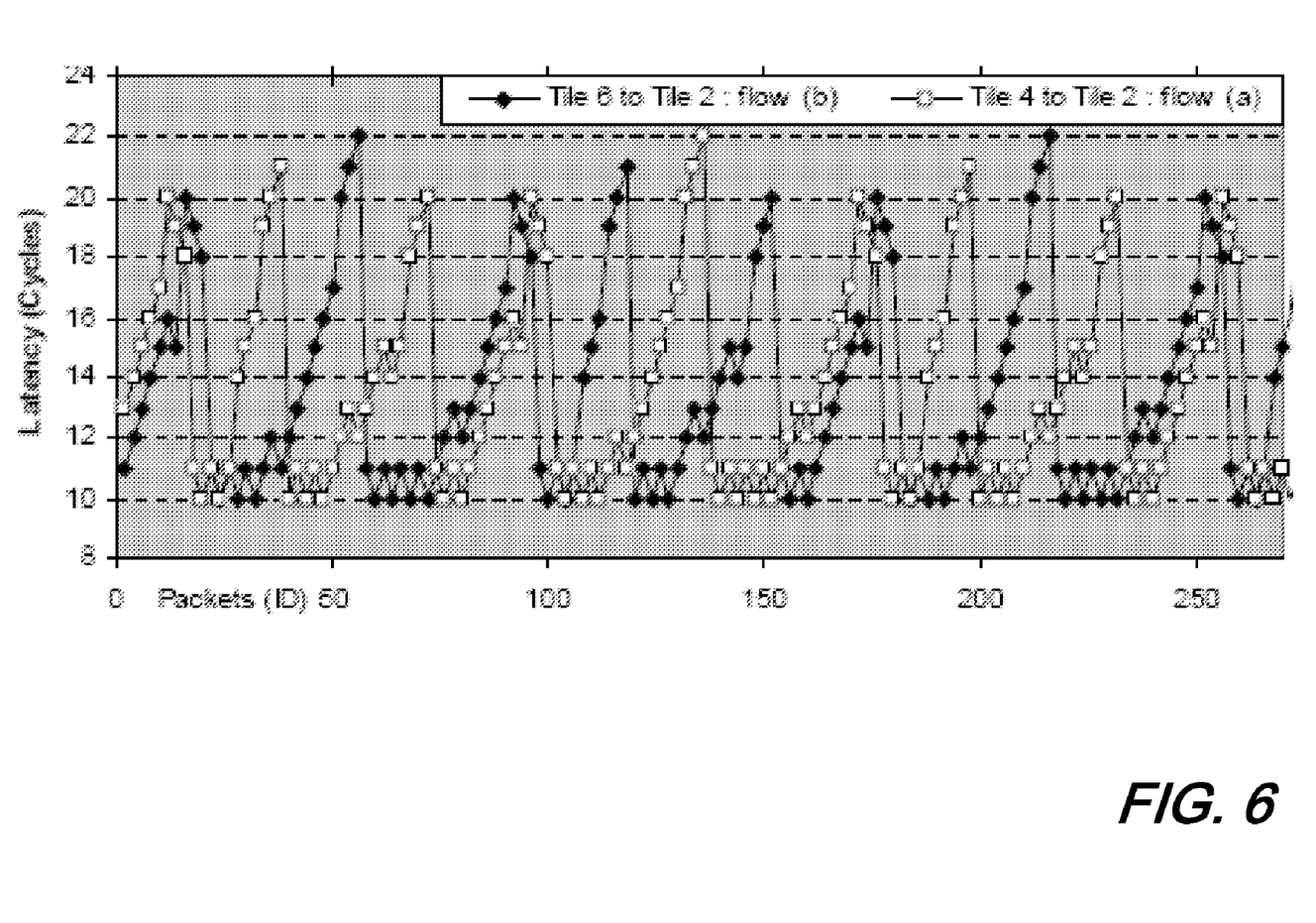
FIG. 6 is a graph showing end-to-end latency for a number of configurations.

A second experiment explores the effect of queue size on NoC fabric. In this experimental setup, the BP threshold values were fixed to two packets and measurements were taken at queue sizes of 8, 6, 4, 3 and 2 packets. FIG. 6 shows the end to end latency for configurations: 8-8-2-2, 6-6-2-2 and 4-4-2-2. Reducing the queue size from 8 to 4 had no effect on NoC characteristics and produced exactly identical latency charts. Queue sizes 3 and 2 resulted in packet loss by the EQ module. This is because when BP signal is set the immediately previous SF module or BP signal is set the immediately previous SF module or sender module stops sending further packets until BP signal is reset. Hence queue size needs to be sufficiently large to accommodate packets that are still sent while the BP signal propagates. In our model queue size needs to be at least two more than BP threshold value.

Experiment 3: Burst Traffic

A third experiment explores burst traffic conditions. Flow (b) was modified to generate a periodic burst instead of sustained traffic. A reduction in BP threshold reduces the BP propagation time. The advantage is a faster reaction to increased congestion, but a disadvantage is an increased sensitivity of the sender to intermittent burst traffic conditions that could have been absorbed better without alternating routes too frequently. The solution is to keep the threshold values low but to shield the sender from temporary congestions caused by sporadic traffic anomalies. This was achieved by increasing the BP threshold value of internal queues from 2 to 6.

Figure 7:
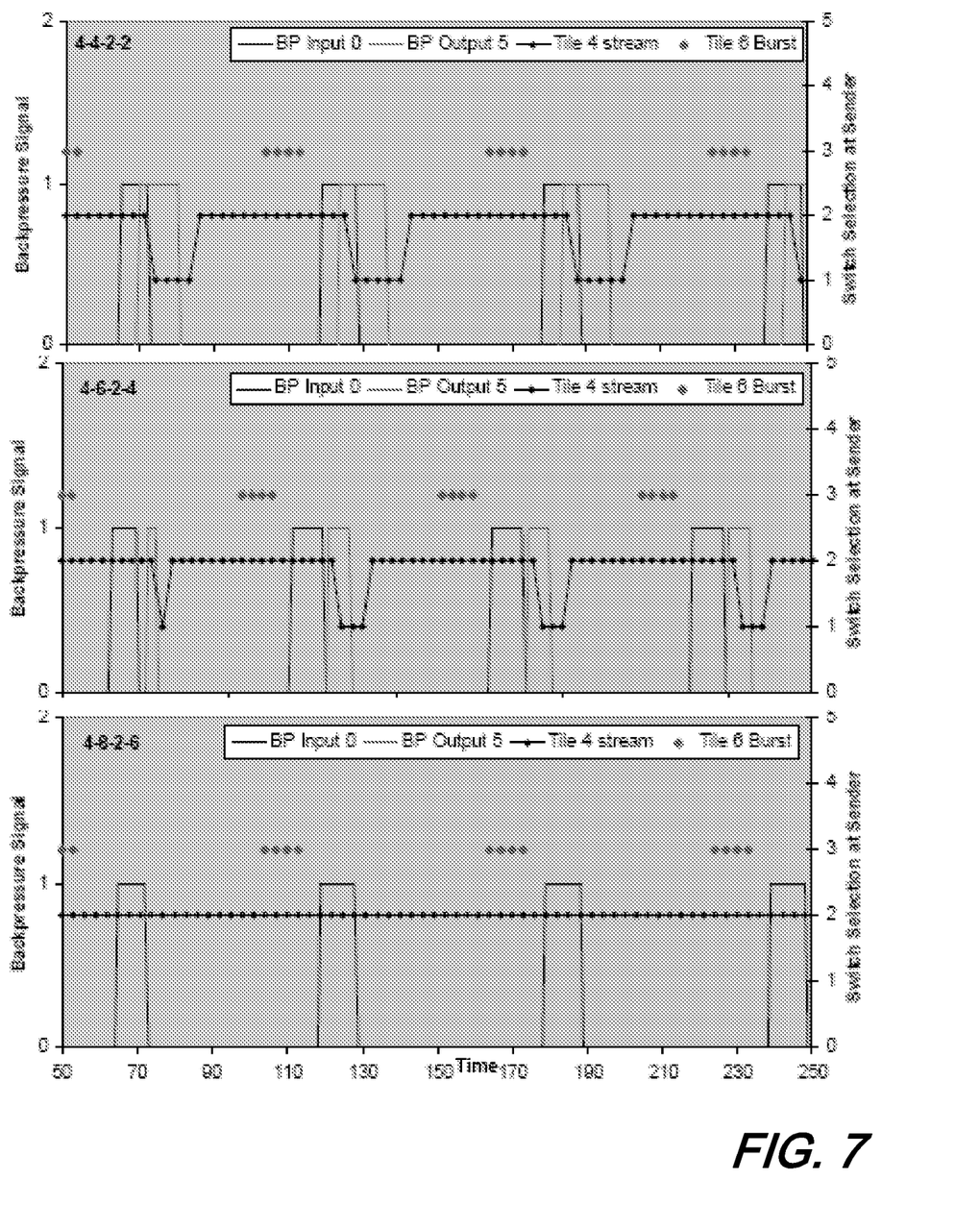
FIG. 7 is a series of graphs showing back pressure propagation and adaptiveness with burst traffic.

This required an increase in the internal queue size because it was established in the second experiment that queue size needs to be at least two more than its BP threshold value. With an increase of the BP threshold value for the internal queue, the number of packets taking the alternate route decreased (See, FIG. 7). With a BP threshold value of 6 packets, none of the packets took the alternate route. Increasing the size of just the internal queue results in increased resilience of the switch to transient burst traffic conditions. The size of all other queues can be kept to their minimum value (4) and also their associated BP level (2). However, a large BP threshold for the internal queue will delay the propagation of backpressure information back to the sender. Thus the benefits of an increased resilience to burst traffic need to be traded-off with the reduced promptness in reacting to sustained congestion conditions.

At this point, while we have discussed and described the invention using some specific examples, our teachings are not so limited. Accordingly, the invention should be only limited by the scope of the claims attached hereto.

The invention claimed is:

1. A network on a chip architecture comprising:
 a rectangular array of tiles disposed upon a chip, each one of said tiles including:
  four identical interconnected switches, each switch having four incoming links and four outgoing links, an enqueing module, an internal memory memory module and a dequeuing module; and
  a receiver unit for interfacing the internal tile to other tiles; and
  a sending unit for interfacing the internal tile to other tiles;
 wherein the four incoming links consist of outside connections, straight connections, internal connections, and across connections; and
 wherein the four outgoing links consist of outside connections, straight connections, internal connections and across connections.

2. The architecture of claim 1 wherein said incoming outside connection conveys packets coming from an adjacent tile; the incoming straight connection conveys packets coming from an adjacent switch within the same tile, the incoming internal connection conveys packets generated within the same tile, and the incoming across connection conveys packets coming from a switch positioned diagonally across from a receiving switch in the same tile.

3. The architecture of claim 2 wherein a packet received at the incoming outside connection may be conveyed in any of four directions.

4. The architecture of claim 3 wherein a packet received at the incoming straight input must have been sent by an adjacent switch inside the same tile and must be sent to the outgoing outside connection.

5. The architecture of claim 4 wherein a packet received at the incoming internal input can only be sent to the outgoing outside connection.

6. The architecture of claim 5 wherein a packet received and the incoming across input must have been sent by a switch diagonally across from the receiving switch on the tile and must be sent to the outgoing outside connection.

7. The architecture of claim 6 wherein multiple packets arriving simultaneously at incoming connections of a particular switch are subject to an arbitration performed by that switches enqueuing module.

8. The architecture of claim 7 wherein a congestion control for a particular switch is performed according to backpressure signals received by the enqueuing module based on queue utilization.

* * * * *